United States Patent
Rajput et al.

(10) Patent No.: US 11,903,174 B2
(45) Date of Patent: Feb. 13, 2024

(54) SYSTEM, METHOD, AND PROGRAM FOR CONTROLLING AIR CONDITIONER OUTPUT FOR RACK PRESSURE REGULATION

(71) Applicant: NEC Corporation, Tokyo (JP)

(72) Inventors: Nirmal Singh Rajput, Tokyo (JP); Yoshinori Miyamoto, Tokyo (JP); Hisato Sakuma, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 172 days.

(21) Appl. No.: 17/440,328

(22) PCT Filed: Mar. 18, 2019

(86) PCT No.: PCT/JP2019/011042
§ 371 (c)(1),
(2) Date: Sep. 17, 2021

(87) PCT Pub. No.: WO2020/188672
PCT Pub. Date: Sep. 24, 2020

(65) Prior Publication Data
US 2022/0151115 A1 May 12, 2022

(51) Int. Cl.
G05B 15/02 (2006.01)
H05K 7/20 (2006.01)
F24F 11/63 (2018.01)

(52) U.S. Cl.
CPC .......... *H05K 7/20836* (2013.01); *F24F 11/63* (2018.01); *G05B 15/02* (2013.01); *H05K 7/20745* (2013.01)

(58) Field of Classification Search
CPC ........ F24F 11/30; F24F 11/62; F24F 2110/10; F24F 11/65; F24F 11/54; F24F 11/77;
(Continued)

(56) References Cited

U.S. PATENT DOCUMENTS 11,096,316 B1 *  8/2021  Lachapelle ........ H05K 7/20145
2003/0067745 A1  4/2003  Patel et al.
(Continued)

FOREIGN PATENT DOCUMENTS

JP  2012-033105 A  2/2012
JP  2014-127087 A  7/2014
(Continued)

OTHER PUBLICATIONS

International Search Report dated May 7, 2019 from the International Searching Authority in International Application No. PCT/JP2019/011042.
(Continued)

*Primary Examiner* — Darrin D Dunn

(57) ABSTRACT

A system (20) for controlling an air conditioner (12) includes a plurality of pressure sensors (19) and a controller (13). Each of the pressure sensors (19) is positioned at an air inlet (15) of each of the racks (11). The controller (13) is configured to receive pressure values from the pressure sensors (19) and control an airflow rate of the cooling air supplied from the air conditioner (12) based on the pressure values. The controller (13) is configured to set a target pressure value for each pressure sensor (19) (S300), acquire a current pressure value for each pressure sensor (S401), calculate a pressure drop value for each pressure sensor (19) between the current pressure value and the target pressure value (S402), and adjust the airflow rate based on a maximum value among the plurality of the pressure drop values (S403 to S410).

4 Claims, 6 Drawing Sheets

(58) Field of Classification Search
CPC .... F24F 11/74; F24F 11/75; F24F 2011/0002;
F24F 11/72; F24F 2221/50; F24F 3/02;
G05B 15/02; G05B 2219/2642; G05B
19/042; G05B 2219/2614; G05B
2219/37401; H05K 7/20736; H05K
7/20836; H05K 7/20745; H05K 7/20145;
H05K 7/20209
See application file for complete search history.

(56) References Cited

U.S. PATENT DOCUMENTS

| | | |
|---|---|---|
| 2005/0270738 A1 | 12/2005 | Hellriegel et al. |
| 2012/0087087 A1 | 4/2012 | Nicolai et al. |
| 2012/0164930 A1 | 6/2012 | Murayama et al. |
| 2014/0330447 A1 | 11/2014 | Vangilder et al. |
| 2015/0003010 A1* | 1/2015 | Kinstle, III ........ H05K 7/20736 361/679.49 |
| 2019/0045669 A1* | 2/2019 | Dawson ............. H05K 7/20836 |

FOREIGN PATENT DOCUMENTS

| | | |
|---|---|---|
| JP | 2016-91524 A | 5/2016 |
| JP | 2017-102792 A | 6/2017 |
| JP | 2017-138673 A | 8/2017 |
| JP | 2018-173864 A | 11/2018 |

OTHER PUBLICATIONS

Extended European Search Report for EP Application No. EP19920031.2 dated Feb. 10, 2022.
JP Office Action for JP Application No. 2021-553158, dated Dec. 27, 2022 with English Translation.

* cited by examiner

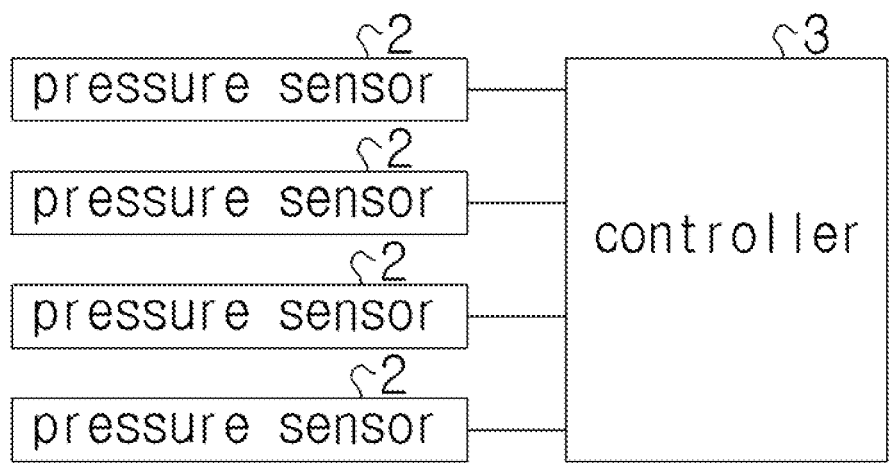
[Fig. 1]

[Fig. 2]
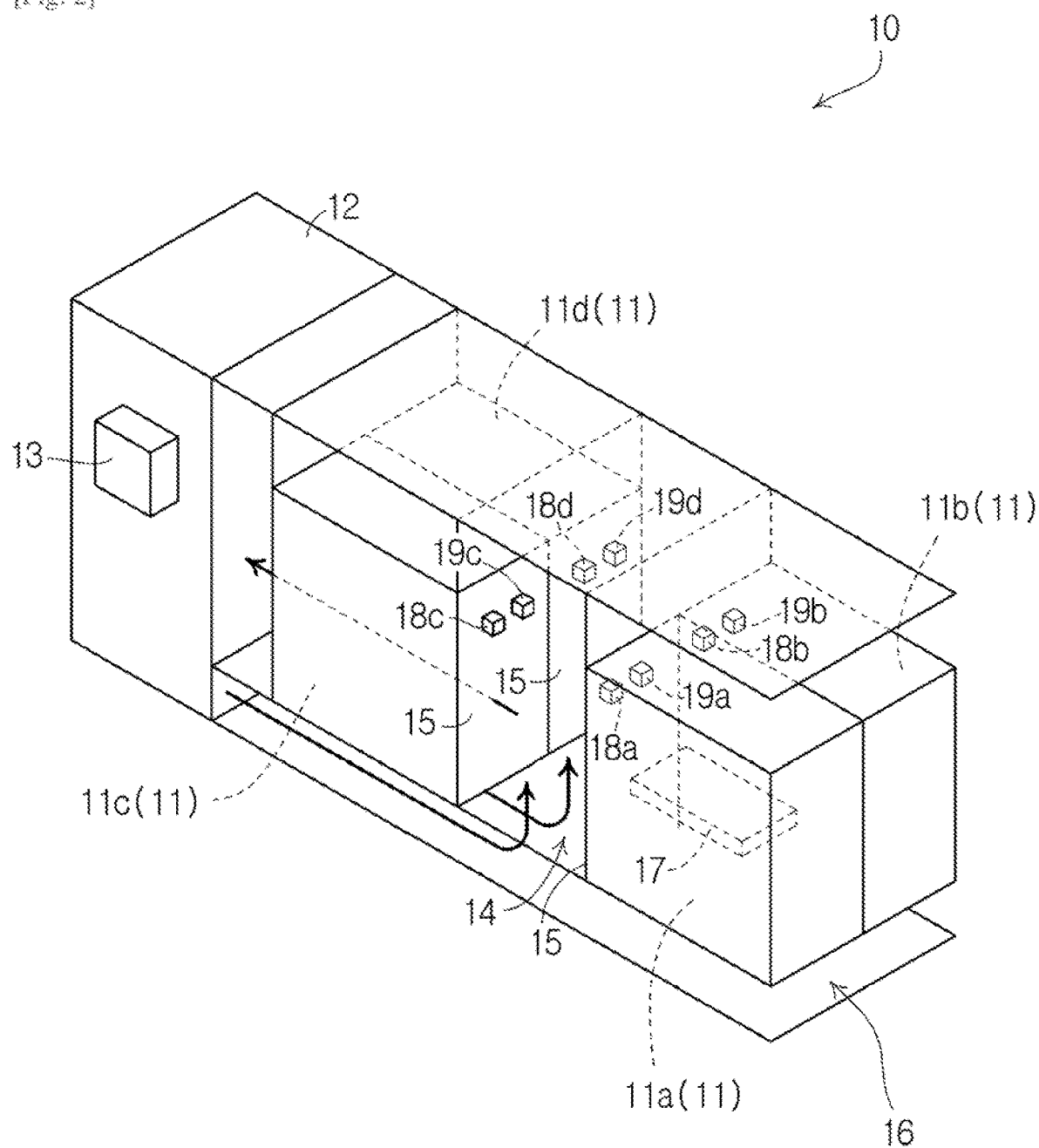

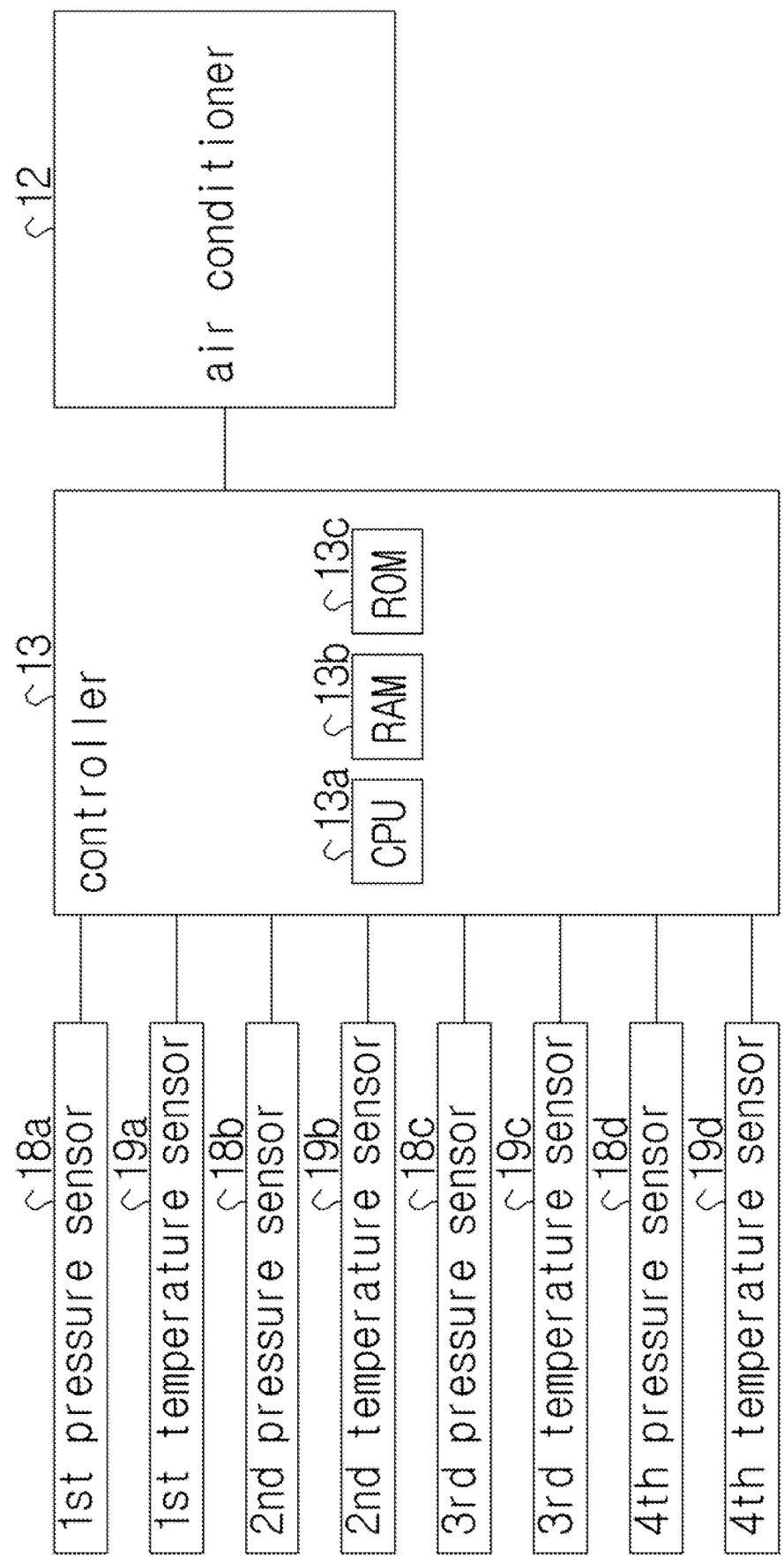
[Fig. 3]

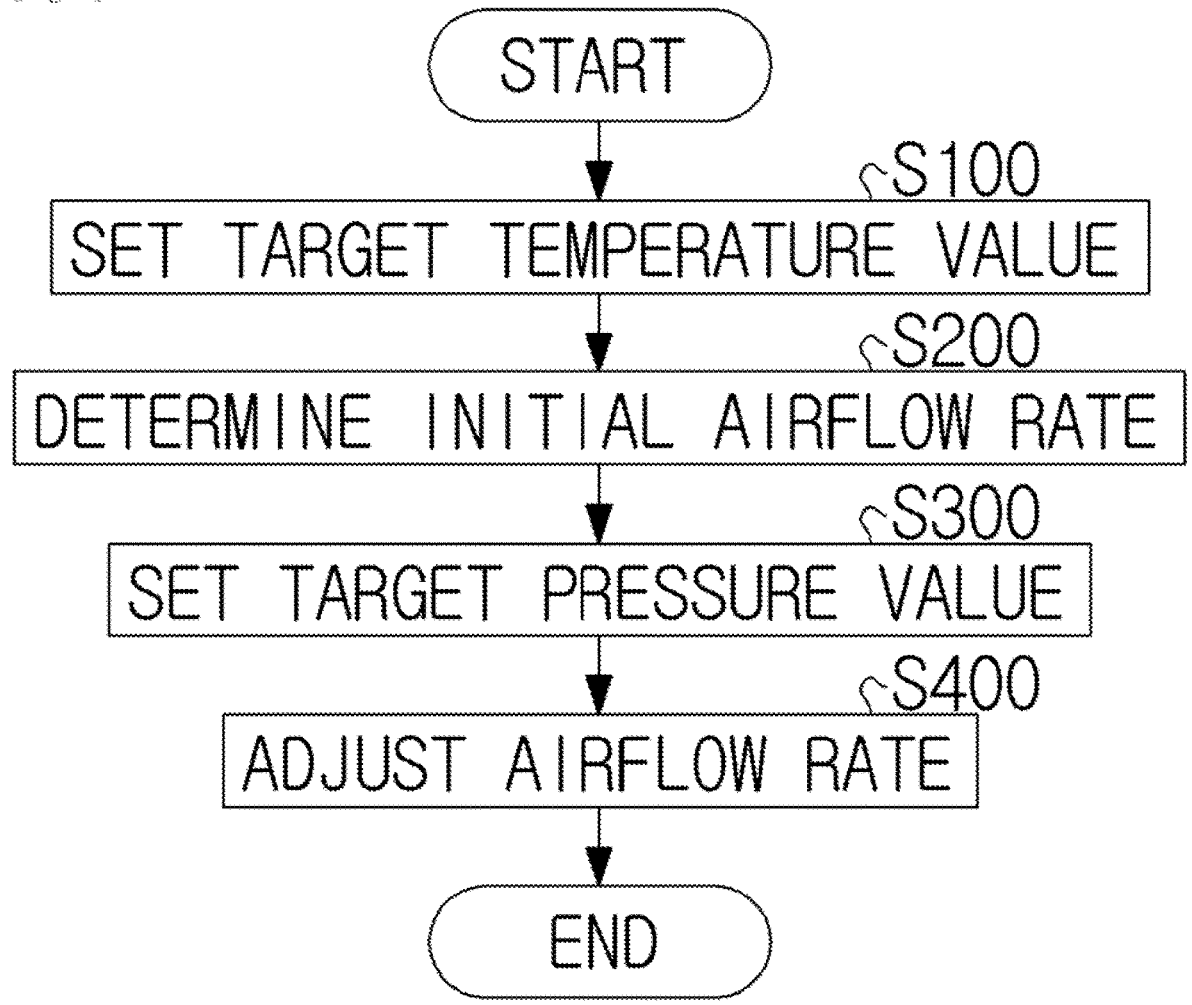
[Fig. 4]

[Fig. 5]
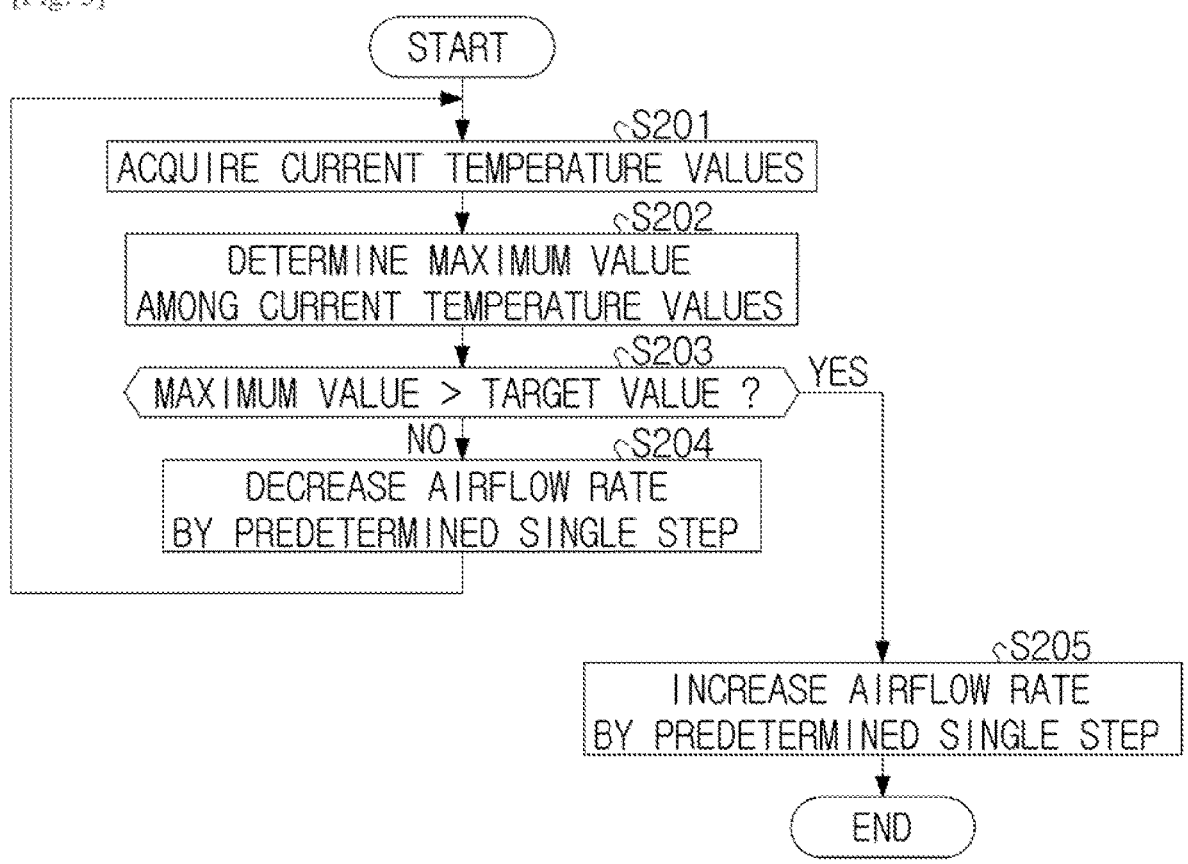

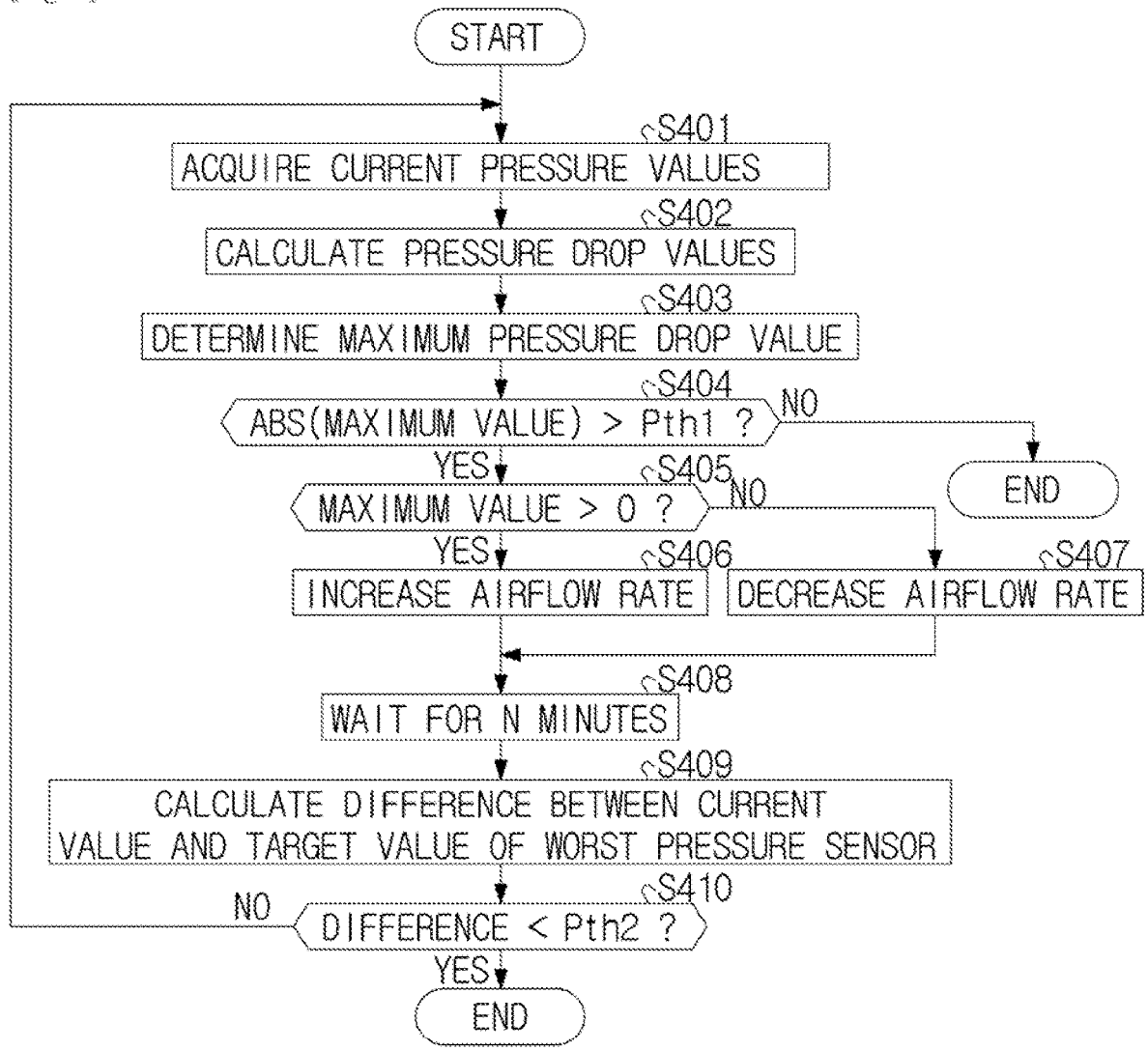
[Fig. 6]

SYSTEM, METHOD, AND PROGRAM FOR CONTROLLING AIR CONDITIONER OUTPUT FOR RACK PRESSURE REGULATION

TECHNICAL FIELD

The present invention relates to a system, method, and program for controlling an air conditioner.

BACKGROUND ART

Various technologies have been used for controlling an air conditioner in a large computer system, such as a data center.

D1 (US2005/0270738A1) discloses a system and methods for cooling computer components housed in cabinets in large computer system. Specifically, the computer system includes a plurality of computer cabinets situated on a double floor in a room. Each of the computer cabinets includes a plurality of computer modules. Each of the cabinets further includes an air inlet portion, an air outlet portion, and an air mover. The air inlet portion is configured to receive high-pressure cooling air from an air conditioner. The air mover is positioned at the air inlet portion to facilitate movement of the cooling air through a chassis of the cabinets.

The system additionally includes pressure sensors and controllers operably coupled to a processor. Each of the controllers is operably connected to a corresponding air mover. Each of the pressure sensors is positioned at a corresponding air inlet portion, and measures a difference in static pressure between an air inside the corresponding cabinet and an air in the room. The processor receives this information from the pressure sensors. Based on this information, the processor determines if the speed of one or more of the air movers needs to be adjusted to maintain a uniform distribution of cooling air between all of the cabinets. If the processor determines that one or more of the air movers needs to be adjusted, the processor transmits appropriate commands to the corresponding controllers.

D1 further discloses, in paragraphs 0028 to 0029 thereof, that the processor is operably coupled to the air conditioner, thereby enabling to increase an airflow rate from the air conditioner if necessary to maintain an adequate flow of cooling air through one or more of the cabinets. One situation in which this may be necessary occurs when the processor determines that one of the cabinets lacks a sufficient flow of cooling air, and the corresponding air mover is unable to sufficiently increase the airflow rate. Otherwise, the processor is operably coupled to the air conditioner, thereby enabling the airflow rate from the air conditioner to be coordinated with the cabinets. For example, if all the cabinets have a surplus airflow rate, the processor can reduce the airflow rate from the air conditioner to save energy.

SUMMARY OF INVENTION

Technical Problem

In the system of D1, since the air movers operably connected to the controllers are indispensable, there is still a room for improvement in terms of costs.

An example object of the present disclosure is to solve one of the above-described problems.

Solution to Problem

An aspect of the present invention is a system for controlling an air conditioner, the air conditioner configured to supply cooling air to a plurality of racks each housing at least one computer module. The system includes a plurality of pressure sensors, each positioned at an air inlet of each of the racks, and a controller configured to receive pressure values from the pressure sensors, and control an airflow rate of the cooling air supplied from the air conditioner based on the pressure values. The controller is configured to (1) set a target pressure value for each pressure sensor, (2) acquire a current pressure value for each pressure sensor, (3) calculate a pressure drop value for each pressure sensor between the current pressure value and the target pressure value, and (4) adjust the airflow rate based on a maximum value among the plurality of the pressure drop values.

An aspect of the present invention is a method for controlling an air conditioner, the air conditioner configured to supply cooling air to a plurality of racks each housing at least one computer module. The method comprising the steps of: (1) setting a target pressure value for each of a plurality of pressure sensors each positioned at an air inlet of each of the racks, (2) acquiring a current pressure value for each pressure sensor, (3) calculating a pressure drop value for each pressure sensor between the current pressure value and the target pressure value, and (4) adjusting the airflow rate based on a maximum value among the plurality of the pressure drop values.

Advantageous Effects of Invention

According to the present invention, it is possible to suppress the power consumption of the air conditioner while supplying sufficient cooling air to the racks at low cost.

BRIEF DESCRIPTION OF DRAWINGS

FIG. 1 is a functional block diagram of a system according to a first exemplary embodiment.

FIG. 2 is a schematic perspective view of a data center according to a second exemplary embodiment.

FIG. 3 is a functional block diagram of a system according to the second exemplary embodiment.

FIG. 4 is a flowchart of an operation of the system according to the second exemplary embodiment.

FIG. 5 is another flowchart of the operation of the system according to the second exemplary embodiment.

FIG. 6 is another flowchart of the operation of the system according to the second exemplary embodiment.

DESCRIPTION OF EMBODIMENTS

Exemplary embodiments of the present invention will be described below with reference to the drawings. In the drawings, the same elements are denoted by the same reference numerals, and thus a repeated description is omitted as needed.

First Exemplary Embodiment

Hereinafter, a first exemplary embodiment of the present invention will be described with reference to FIG. 1.

FIG. 1 shows a system 1 for controlling an air conditioner. The air conditioner supplies cooling air to a plurality of racks. Each of the racks houses at least one computer module.

The system 1 includes a plurality of pressure sensors 2 and a controller 3.

Each of the pressure sensors 2 is positioned at an air inlet of each of the racks.

The controller 3 receives pressure values from the pressure sensors 2. The controller 3 controls an airflow rate of the cooling air supplied from the air conditioner based on the pressure values.

The controller 3 operates as follows.

The controller 3 sets a target pressure value for each pressure sensor 2.

The controller 3 acquires a current pressure value for each pressure sensor 2.

The controller 3 calculates a pressure drop value for each pressure sensor 2 by subtracting the current pressure value from the target pressure value.

The controller 3 adjusts the airflow rate based on a maximum value among the plurality of the pressure drop values.

According to the above structure, it is possible to suppress the power consumption of the air conditioner while supplying sufficient cooling air to the racks at low cost.

Second Exemplary Embodiment

Referring next to FIGS. 2 to 5, a second exemplary embodiment of the present invention will be described.

FIG. 2 shows a schematic perspective view of a data center 10. The data center 10 includes a plurality of racks 11, an air conditioner 12 that supplies cooling air to the racks 11, a controller 13 that controls an airflow rate of the cooling air supplied from the air conditioner 12.

The racks 11 includes a first rack 11a, a second rack 11b, a third rack 11c, and a forth rack 11d. The first rack 11a and the second rack 11b are arranged side by side along the longitudinal direction of a cold aisle 14. Similarly, the third rack 11c and the forth rack 11d are arranged side by side along the longitudinal direction of the cold aisle 14.

The first rack 11a is arranged on the other side of the third rack 11c across the cold aisle 14. The second rack 11b is arranged on the other side of the forth rack 11d across the cold aisle 14.

An air inlet 15 of the first rack 11a faces the cold aisle 14. Similarly, an air inlet 15 of the second rack 11b, an air inlet 15 of the third rack 11c, and an air inlet 15 of the forth rack 11d face the cold aisle 14.

The air conditioner 12 supplies cooling air to the racks 11 through a double floor 16 and the cold aisle 14 in this recited order. As well known, chilled water with constant temperature is supplied to the air conditioner 12, hence the temperature of the cooling air supplied from the air conditioner 12 is always constant.

In this exemplary embodiment, as shown in FIG. 2, only four racks 11 are depicted. However, the data center 10 may include five or more racks 11, and various arrangements thereof may be employed.

Each of the racks 11 includes at least one computer module 17, preferably a plurality of computer modules 17. Each of the computer modules 17 includes a CPU (central processing unit), a CPU fan, and a fan controller that controls the rotation speed of the CPU fan based on the temperature of the CPU.

The data center 10 further includes a plurality of temperature sensors 18 and a plurality of pressure sensors 19.

The temperature sensors 18 includes a first temperature sensor 18a, a second temperature sensor 18b, a third temperature sensor 18c, and a forth temperature sensor 18d. The temperature sensors 18 are operably coupled to the controller 13.

The pressure sensors 19 includes a first pressure sensor 19a, a second pressure sensor 19b, a third pressure sensor 19c, and a forth pressure sensor 19d. The pressure sensors 19 are operably coupled to the controller 13.

The first temperature sensor 18a and the first pressure sensor 19a are positioned at the air inlet 15 of the first rack 11a. Hence, the first temperature sensor 18a is configured to measure the temperature of the cooling air at the air inlet 15 of the first rack 11a. Similarly, the first pressure sensor 19a is configured to measure the pressure of the cooling air at the air inlet 15 of the first rack 11a. The first temperature sensor 18a and the first pressure sensor 19a may also be positioned on the air inlet 15 of the first rack 11a.

Since the arrangement and the operation of the other temperature sensors 18 and the other pressure sensors 19 is the same as that of the first temperature sensor 18a and the first pressure sensor 19a, its explanation will be omitted.

Each of the pressure sensors 19 may be a barometric pressure sensor that measures absolute pressure. Instead, each of the pressure sensors 19 may be a gage pressure sensor that measures a pressure difference between a pressure at a reference position and a pressure at a target position. The target position may be a position at the air inlet 15 of the racks 11, and the reference position may be a position at a top surface of the racks 11 that faces upward.

FIG. 3 shows a functional block diagram of the data center 10.

As shown in FIG. 3, the controller 13 includes a CPU 13a (Central Processing Unit), a RAM 13b (Random Access Memory), and a ROM 13c (Read Only Memory). A program stored in the ROM 13c is read out by the CPU 13a and is executed on the CPU 13a, so that the program causes hardware, such as the CPU 13a, to operate steps shown in FIGS. 4 to 6. The operation of the controller 13 will be described with reference to FIGS. 4 to 6 hereinafter.

In a table 1 and 2, first and second examples of various parameters such as power consumption, output values of the temperature sensors 18 and the pressure sensors 19 are shown respectively for understanding promotion. In the table 1 and 2, "CA temp" represents the temperature of the cooling air supplied from the air conditioner 12, "Power" represents power consumption of computer modules 17 housed in each rack, "Temp" represents an output value of the temperature sensors 18, and "Pressure" represents an output value of the pressure sensors 19.

TABLE 1

| | | First Rack | | | Second Rack | | | Third Rack | | | Forth Rack | | |
|---|---|---|---|---|---|---|---|---|---|---|---|---|---|
| Time | CA Temp °C. | Power kW | Temp °C. | Pressure Pa | Power kW | Temp °C. | Pressure Pa | Power kW | Temp °C. | Pressure Pa | Power kW | Temp °C. | Pressure Pa |
| t1 | 27 | 8.1 | 27.0 | 83 | 8.3 | 26.9 | 80 | 8.0 | 27.0 | 121 | 8.3 | 27.1 | 125 |
| t2 | 27 | 10.5 | 28.1 | 35 | 10.7 | 28.3 | 37 | 10.4 | 28.2 | 73 | 10.6 | 28.1 | 74 |
| (drop) | — | — | — | 48 | — | — | 43 | — | — | 48 | — | — | 51 |
| t3 | 27 | 10.6 | 26.9 | 79 | 10.7 | 27.1 | 81 | 10.3 | 27.0 | 117 | 10.8 | 27.1 | 128 |

TABLE 2

| Time | CA Temp °C. | First Rack | | | Second Rack | | | Third Rack | | | Forth Rack | | |
|---|---|---|---|---|---|---|---|---|---|---|---|---|---|
| | | Power kW | Temp °C. | Pressure Pa | Power kW | Temp °C. | Pressure Pa | Power kW | Temp °C. | Pressure Pa | Power kW | Temp °C. | Pressure Pa |
| t1 | 22 | 8.1 | 26.8 | −35 | 8.2 | 27.0 | −37 | 8.0 | 25.5 | 6 | 8.1 | 25.7 | 9 |
| t2 | 22 | 10.9 | 28.6 | −88 | 7.9 | 28.4 | −35 | 6.1 | 27.6 | 32 | 5.9 | 27.8 | 36 |
| (drop) | — | — | — | 53 | — | — | −2 | — | — | −26 | — | — | −27 |
| t3 | 22 | 10.8 | 26.7 | −33 | 7.8 | 26.8 | −7 | 6.2 | 25.3 | 28 | 5.8 | 25.4 | 26 |

Step S100:

In step S100, the controller 13 acquires a target temperature value according to an input of a user, or from the RAM 13b, and sets the target temperature value. This target temperature value may depend upon standard such as ASHRAE (American Society of Heating, Refrigerating and Air-Conditioning Engineers) or may depend upon data center operation or customer policy. In this exemplary embodiment, for example, 27 degrees is employed as the target temperature value.

Step S200:

In step S200, the controller 13 determines an initial airflow rate of the cooling air supplied from the air conditioner 12 based on the target temperature value acquired in step S100. A detailed process for step 200 is shown in FIG. 5 and will be explained later in detail. FIG. 5 shows an example of the determination. However, any other generic method is also applicable. Usually, the air conditioner 12 is installed and operated with a rated fan speed, hence the air conditioner 12 supplies the cooling air with rated airflow rate. In the steps shown in FIG. 5, the controller 13 tries to reduce power consumption of the air conditioner 12 through reduction of excess airflow rate. The various parameters in the Tables 1 and 2 at Time t1 are parameters after step S200 is completed with the above-mentioned target temperature value of 27 degrees.

Step S300:

After determining the initial airflow rate of the cooling air supplied from the air conditioner 12, the controller 13 sets a target pressure value for each pressure sensor 19. Specifically, the controller 13 reads output values of the pressure sensors 19, and stores the values in RAM 13b as target pressure values. For example, the controller 13 sets the target pressure value of the first pressure sensor 19a as 83 Pa, that of the second pressure sensor 19b as 80 Pa.

When power consumption of each rack 19 varies, the current (i.e. instantaneous) output values of the pressure sensors 19 changes with respect to the target pressure values. Then, the controller 13 controls the airflow rate of the cooling air supplied from the air conditioner 12 based on differences between the current pressure values and the target pressure values in such a manner that the current pressure values are restored and approaches the target pressure values. The process for the restoration of the current pressure values is described in the following step S400.

As shown in Table 1, the target pressure values, which are the pressure values at Time t1, are obtained as 83 Pa, 80 Pa, 121 Pa, and 125 Pa. The target pressure values in table 1 are all positive, which means that excess amount of airflow rate is present. This happens because the temperature of the cooling air supplied from the air conditioner 12 is 27 degrees, and an excess airflow rate is required to avoid any hot air recirculation, otherwise the output values of the temperature sensors 18 will exceed the target temperature value set in step S100.

As shown in Table 2, the target pressure values, which are the pressure values at Time t1, are obtained as −35 Pa, −37 Pa, 6 Pa, and 9 Pa. Some of the target pressure values in table 2 are positive, the other are negative. This means that some racks 11 receive less airflow rate than required and the other racks 11 receive excess airflow rate. This condition is not problematic because the resultant output values of the temperature sensors 18 are less than the target temperature value set in step S100. This distribution including positive values and negative values of the target pressure values happens because the temperature of the cooling air supplied from the air conditioner 12 is sufficiently low (i.e. 22 degrees), and even in case of hot air recirculation occurrence, the output values of the temperature sensors 18 can be maintained with the target temperature value (i.e. 27 degrees).

Step S400:

In step S400, the controller 13 adjusts the airflow rate of the cooling air supplied from the air conditioner 12. The detailed explanation for step S400 will be described in FIG. 6.

Hereinafter, a flowchart shown in FIG. 5 will be described.

Step S201:

In step S201, the controller 13 acquires the current temperature values output from the temperature sensors 18.

Step S202:

In step S202, the controller 13 determines a maximum value among the current temperature values obtained in step S201.

Step S203:

In step S203, the controller 13 determines whether the maximum value obtained in step S202 is greater than the target temperature value set in step S100 or not. Due to variation of power consumption of the racks 11, the current temperature values obtained in step S201 varies somewhat. In order to absorb the variation, the maximum value among the current temperature values obtained in step S201 is utilized for determination of the initial airflow rate of the cooling air supplied from the air conditioner 12. If the maximum value is less than the target temperature value, then current airflow rate is considered as acceptable for continuous operation.

If the maximum is less than the target temperature value (i.e. S203:NO), then the controller 13 sends a command to the air conditioner 12 to decrease the airflow rate of the cooling air supplied from the air conditioner 12 by a predetermined single step, thereby removing over-cooling for the racks 11. The reduction of the airflow rate can be performed by several methods such as decreasing fan speed of a fan mounted on the air conditioner 12, or closing some dampers mounted on the air conditioner 12.

If the maximum is more than the target temperature value (i.e. S203:YES), then the controller 13 sends a command to the air conditioner 12 to increase the airflow rate of the cooling air supplied from the air conditioner 12 by a predetermined single step, thereby allowing the air conditioner 12 to operate at minimum airflow rate while satisfying the temperature requirement for the racks 11.

Hereinafter, a flowchart shown in FIG. 6 will be described.

Step 401:

In step 401, the controller 13 acquires current pressure values output from the pressure sensors 19.

In case of Table 1, as the power consumption of the racks 11 increased between Time t1 and Time t2, the current pressure values output from the pressure sensors 19 are obtained as 35 Pa, 37 Pa, 73 Pa, and 74. In case of Table 2, as the distribution of the power consumption of the racks 11 changed between Time t1 and Time t2, the current pressure values output from the pressure sensors 19 are obtained as −88 Pa, −35 Pa, 32 Pa, and 36 Pa.

Step S402:

In step S402, the controller 13 calculates pressure drop values as indicated in Tables 1 and 2 with the term of "(drop)" by subtracting the current pressure value from the target pressure value for each pressure sensor 19.

In case of Table 1, the pressure drop values are obtained as +48 Pa, +43 Pa, +48 Pa, and +51 Pa.

In case of Table 2, the pressure drop values are obtained as +53 Pa, −2 Pa, −26 Pa, and −27 Pa.

Step S403:

In step S403, the controller 13 determines a maximum value among the pressure drop values obtained in step S402.

In case of Table 1, the maximum value is 51 Pa that is read from the forth pressure sensor 19d.

In case of Table 2, the maximum value is 53 Pa that is read from the first pressure sensor 19a.

Step S404:

In step S404, the controller 13 determines whether absolute value of the maximum value exceeds a threshold Pth1 or not. If the absolute value of the maximum value exceeds the threshold Pth1, the controller 13 advances the processing to the next step S405. Otherwise, if the absolute value of the maximum value does not exceed the threshold Pth1 (i.e. step S404:NO), then the controller 13 ends the processing. The threshold Pth1 may be five Pa. The threshold Pth1 is set to simplify processing by ignoring minute fluctuations.

Step S405 to S407:

In step S405, the controller 13 determines whether the maximum value is positive value or not. If the maximum value is positive, the controller 13 sends a command to the air conditioner 12 to increase the airflow rate of the cooling air supplied from the air conditioner 12 by a predetermined single step in step S406. Otherwise, if the maximum value is negative, the controller 13 sends a command to the air conditioner 12 to decrease the airflow rate of the cooling air supplied from the air conditioner 12 by the predetermined single step in step S407.

It is noted that when the maximum value is positive value, it implies that a corresponding rack 11 requires more cooling air, resulting in that the pressure at the air inlet 15 of the corresponding rack 11 decreased. Otherwise, when the maximum value is negative value, it implies that a corresponding rack 11 requires less cooling air, resulting in that the pressure at the air inlet 15 of the corresponding rack 11 increased.

As a controlling method of the airflow rate of the cooling air supplied from the air conditioner 12, a PID (Proportional-Integral-Differential) method can be employed based on the maximum value.

S408:

In step S408, the controller 13 waits for predetermined minutes. The predetermined minutes can be changed as required. The Predetermined minutes can be decided such that the period is sufficient to achieve steady state after changing of the airflow rate of the cooling air supplied from the air conditioner 12.

S409:

In step S409, the controller 13 acquires current pressure value at Time t3 output from the pressure sensor 19 that corresponds to the maximum value, and calculates difference between the current pressure value output from the pressure sensor 19 that corresponds to the maximum value and the target pressure value of the same.

In case of Table 1, the pressure sensor 19 that corresponds to the maximum value is the forth pressure sensor 19d, hence the difference is three Pa obtained by comparing 125 Pa with 128 Pa.

In case of Table 2, the pressure sensor 19 that corresponds to the maximum value is the first pressure sensor 19a, hence the difference is two Pa obtained by comparing −35 Pa and −33 Pa.

S410:

In step S410, the controller 13 determines whether the difference is less than a predetermined threshold Pth2 or not. If the difference is less than a predetermined threshold Pth2, the controller 13 ends the processing. Otherwise, the controller 13 returns the processing to step S401. The predetermined threshold Pth2 may be five Pa. The threshold Pth2 is set to determine whether the pressure drop has been eliminated.

The second exemplary embodiment of the present invention described above has the following features.

As shown in FIG. 2, a system 20 for controlling an air conditioner 12 includes a plurality of pressure sensors 19 and a controller 13. The air conditioner 12 is configured to supply cooling air to a plurality of racks 11 each housing at least one computer module 17. Each of the pressure sensors 19 is positioned at an air inlet 15 of each of the racks 11. The controller 13 is configured to receive pressure values from the pressure sensors 19 and control an airflow rate of the cooling air supplied from the air conditioner 12 based on the pressure values. The controller 13 is configured to set a target pressure value for each pressure sensor 19 (S300), acquire a current pressure value for each pressure sensor (S401), calculate a pressure drop value for each pressure sensor 19 between the current pressure value and the target pressure value (S402), and adjust the airflow rate based on a maximum value among the plurality of the pressure drop values (S403 to S410). According to the above structure, it is possible to suppress the power consumption of the air conditioner 12 while supplying sufficient cooling air to the racks 11 at low cost.

In the present exemplary embodiment, the controller 13 is configured to calculate the pressure drop value for each pressure sensor 19 by subtracting the current pressure value from the target pressure value (S402). However, the controller 13 may be configured to calculate the pressure drop value for each pressure sensor 19 by subtracting the target pressure value from the current pressure value.

Further, the controller 13 is configured to increase the airflow rate when the maximum value is a positive value (S406), and decrease the airflow rate when the maximum value is a negative value (S407). According to the above structure, it is possible to reliably suppress the power consumption of the air conditioner 12 while supplying sufficient cooling air to the racks 11.

As shown in FIGS. 2 and 3, the system 20 further includes a plurality of temperature sensors 18 each positioned at the air inlet 15 of each of the racks 11. As shown in FIG. 5, the controller 13 is configured to acquire temperature values from the temperature sensors 18 (S201), adjust the airflow rate in such a manner that a maximum value among the temperature values approaches a target temperature value as a first value (S202 to S205), and set the pressure values after the adjustment as the target pressure values (S300). According to the above structure, it is possible to reliably suppress the power consumption of the air conditioner 12.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line, such as electric wires and optical fibers, or a wireless communication line.

While the present invention has been described above with reference to exemplary embodiments, the present invention is not limited to the above exemplary embodiments. The configuration and details of the present invention can be modified in various ways which can be understood by those skilled in the art within the scope of the invention.

REFERENCE SIGNS LIST 10 data center
11 rack
12 air conditioner
13 controller
14 cold aisle
15 air inlet
16 double floor
17 computer module
18 temperature sensor
19 pressure sensor
20 system

The invention claimed is:

1. A system for controlling an air conditioner configured to supply cooling air to a plurality of racks that each house at least one computer module, the system comprising:
a plurality of sensors including a plurality of pressure sensors and a plurality of temperature sensors, each sensor positioned at an air inlet of a corresponding racks;
a processor; and
a memory storing instructions executable by the processor to:
receive pressure values from the pressure sensors and temperature values from the temperature sensors, and control an airflow rate of the cooling air supplied from the air conditioner based on the pressure values and the temperature values, by:
acquiring a current temperature value for each temperature sensor;
adjusting the airflow rate in such a manner that a maximum temperature value among the temperature values approaches a first value;
after adjusting the airflow rate, setting a target pressure value for each pressure sensor;
acquiring a current pressure value for each pressure sensor;
calculating a pressure drop value for each pressure sensor between the current pressure value and the target pressure value; and
adjusting the airflow rate based on a maximum pressure value among the plurality of the pressure drop values.

2. The system according to claim 1, wherein
the instructions are executable by the processor to further increase the airflow rate when the maximum pressure value is a positive value, and decrease the airflow rate when the maximum pressure value is a negative value.

3. A method for controlling an air conditioner configured to supply cooling air to a plurality of racks that each house at least one computer module, the method comprising:
receiving, by a processor, pressure values from a plurality of pressure sensors of a plurality of sensors that are each positioned at an air inlet of a corresponding rack, and temperature values from a plurality of temperature sensors of the plurality of sensors, and controlling an airflow rate of the cooling air supplied from the air conditioner based on the pressure values and the temperature values, by:
acquiring a current temperature value for each temperature sensor;
adjusting the airflow rate in such a manner that a maximum temperature value among the temperature values approaches a first value;
after adjusting the airflow rate, setting a target pressure value for each pressure sensor;
acquiring a current pressure value for each pressure sensor;
calculating a pressure drop value for each pressure sensor between the current pressure value and the target pressure value; and
adjusting the airflow rate based on a maximum pressure value among the pressure drop values.

4. A non-transitory computer readable media storing a program executable by a computer to perform the method of claim 3.

* * * * *